United States Patent
Wu et al.

(10) Patent No.: US 9,654,068 B2
(45) Date of Patent: May 16, 2017

(54) QUATERNARY/TERNARY MODULATION SELECTING CIRCUIT AND ASSOCIATED METHOD

(71) Applicant: Elite Semiconductor Memory Technology Inc., Hsinchu (TW)

(72) Inventors: Shuen-Ta Wu, Hsinchu (TW); Yen-Chun Chen, Hsinchu County (TW)

(73) Assignee: Elite Semiconductor Memory Technology Inc., Hsinchu (TW)

(*) Notice: Subject to any disclaimer, the term of this patent is extended or adjusted under 35 U.S.C. 154(b) by 6 days.

(21) Appl. No.: 14/656,731

(22) Filed: Mar. 13, 2015

(65) Prior Publication Data

US 2016/0268984 A1    Sep. 15, 2016

(51) Int. Cl.
  *H03F 3/38*  (2006.01)
  *H03F 3/217*  (2006.01)
  *H03F 3/183*  (2006.01)
  *H03F 3/45*  (2006.01)

(52) U.S. Cl.
  CPC ............ *H03F 3/217* (2013.01); *H03F 3/183* (2013.01); *H03F 3/45475* (2013.01); *H03F 2200/03* (2013.01); *H03F 2200/171* (2013.01); *H03F 2200/264* (2013.01); *H03F 2200/351* (2013.01); *H03F 2203/45116* (2013.01)

(58) Field of Classification Search
  CPC .......... H03F 3/387; H03F 3/183; H03F 3/217; H03F 3/45071
  USPC ....... 330/10, 207 A, 251; 375/238; 381/120, 381/121
  See application file for complete search history.

(56) References Cited

U.S. PATENT DOCUMENTS

| | | | | |
|---|---|---|---|---|
| 5,077,539 A * | 12/1991 | Howatt | ................. | H03F 1/0277 323/283 |
| 6,472,933 B2 * | 10/2002 | Hsu | ........................ | H03F 3/2173 330/10 |
| 6,614,297 B2 * | 9/2003 | Score | ....................... | H03F 3/217 330/10 |
| 7,339,425 B2 * | 3/2008 | Yang | ........................ | H03F 1/26 330/10 |
| 8,008,969 B1 * | 8/2011 | Forejt | ..................... | H03F 3/005 330/10 |
| 2013/0222063 A1 * | 8/2013 | Bassoli | ..................... | H03F 1/26 330/251 |

* cited by examiner

*Primary Examiner* — Khanh V Nguyen
(74) *Attorney, Agent, or Firm* — Winston Hsu; Scott Margo

(57) ABSTRACT

A quaternary/ternary modulation selecting method of an audio amplifier includes: generating a ternary signal and a quaternary signal; generating a plurality of pulses with limited duty cycles; and selecting one of the quaternary signal, the ternary signal and the plurality of pulses for an output stage of the audio amplifier.

20 Claims, 10 Drawing Sheets

US 9,654,068 B2

QUATERNARY/TERNARY MODULATION SELECTING CIRCUIT AND ASSOCIATED METHOD

BACKGROUND OF THE INVENTION

1. Field of the Invention

The present invention relates to an audio amplifier, and more particularly, to a quaternary/ternary modulation selecting circuit of an audio amplifier and an associated method.

2. Description of the Prior Art

In audio applications, an analog amplifier is one of the most important parts in an audio system. Efficiency is a critical issue; a class D power amplifier is the most popular kind used in audio systems due to its higher efficiency compared to other kinds of amplifier. Because the output waveform of the class D power amplifier is a modulation signal between two voltage levels (i.e. supply voltage and ground) rather than a common linear waveform, ideally no current will pass through when the transistors of the output stage are non-conductive. Currently, a common modulation method applied in the class D power amplifier is Pulse Width Modulation (PWM), wherein quaternary modulation has the advantages of better total harmonic distortion (THD) and lower noise floor and is better for operating under small power conditions; ternary modulation, however, has the advantages of better efficiency and better Electro Magnetic Interference (EMI) performance and is better for operating under large power conditions. A quaternary/ternary modulation selecting circuit which can combine the above advantages is therefore a popular architecture in prior art class D amplifiers. There is an inrush current issue when the mode of the selecting circuit changes to the quaternary modulation from the ternary modulation, and when the selecting circuit starts up at power on, both of which might cause damage to the device. Consequently, how to achieve over-current protection in a quaternary/ternary modulation selecting circuit is an important issue in this field.

FIG. 1 is a diagram illustrating the over-current occurring in a prior art class D power amplifier. As shown in FIG. 1, the inrush current occurs in the first two pulses of the quaternary signal immediately after the mode of the quaternary/ternary modulation selecting circuit changes to the quaternary modulation from the ternary modulation and in the first two pulses of the quaternary signal immediately after the amplifier starts up. In addition, the current increases when the quaternary signal is high and goes down when the quaternary signal is low. Therefore, if the duty cycles of the first few signals are too high, the inrush current becomes much stronger.

SUMMARY OF THE INVENTION

One of the objectives of the present invention is to provide a quaternary/ternary modulation selecting circuit and an associated method to solve the above-mentioned problem.

According to an embodiment of the present invention, a quaternary/ternary modulation selecting circuit of an audio amplifier comprises: a signal generating circuit, a pulse generating circuit and a selecting unit, wherein the signal generating circuit is arranged to generate a ternary signal and a quaternary signal, the pulse generating circuit is arranged to generate a plurality of pulses with limited duty cycles, and the selecting circuit is arranged to select one of the quaternary signal, the ternary signal and the plurality of pulse for an output stage of the audio amplifier.

According to an embodiment of the present invention, a quaternary/ternary modulation selecting method of an audio amplifier comprises: generating a ternary signal and a quaternary signal; generating a plurality of pulses with limited duty cycles; and selecting one of the quaternary signal, the ternary signal and the plurality of pulses for an output stage of the audio amplifier.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
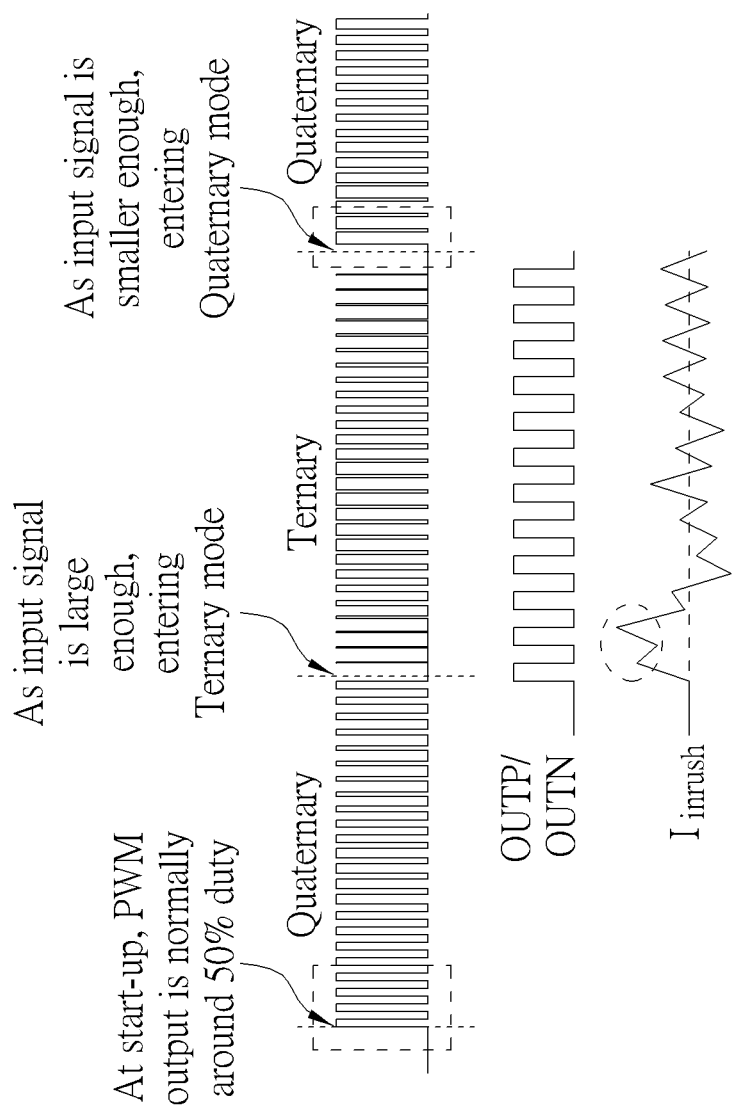
FIG. 1 is a diagram illustrating the over-current occurring in a prior art class D power amplifier.
Figure 2:
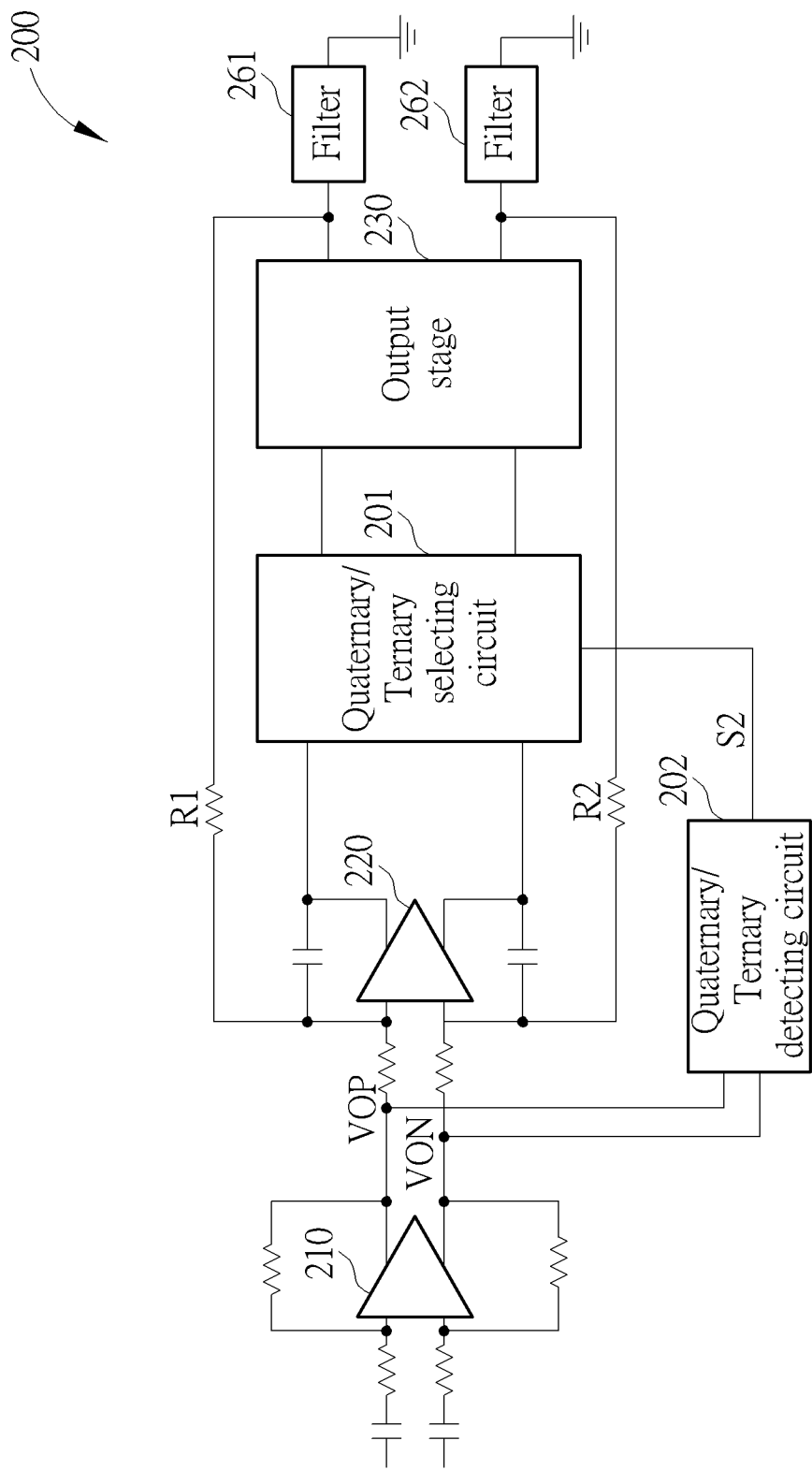
FIG. 2 is a diagram illustrating an audio amplifier with a quaternary/ternary modulation selecting circuit according to an embodiment of the present invention.

FIG. 2 is a diagram illustrating an audio amplifier 200 with a quaternary/ternary modulation selecting circuit 201 according to an embodiment of the present invention. In this embodiment, the audio amplifier 200 is a class D power amplifier, and the audio amplifier 200 comprises a gain stage 210, an integrator 220, the quaternary/ternary modulation selecting circuit 201, a quaternary/ternary detecting circuit 202, an output stage 230, two feedback resistors R1 and R2, and two filters 261 and 262. The quaternary/ternary modulation selecting circuit 201 is arranged to select one of the quaternary signal, the ternary signal and at least one pulse with a limited duty cycle, and the quaternary/ternary detecting circuit 202 is arranged to detect the output signals $V_{op}/V_{ON}$ of the gain stage 210 and send a signal S2 to the quaternary/ternary modulation selecting circuit 201 according to the output signals $V_{op}/V_{ON}$ of the gain stage 210 to decide which signal should be outputted to the output stage 230 by the quaternary/ternary modulation selecting circuit 201. The other components are similar to corresponding parts of a traditional class D power amplifier; as their function should be well-known to a person skilled in the art, a detailed description is omitted here for brevity.

Figure 3:
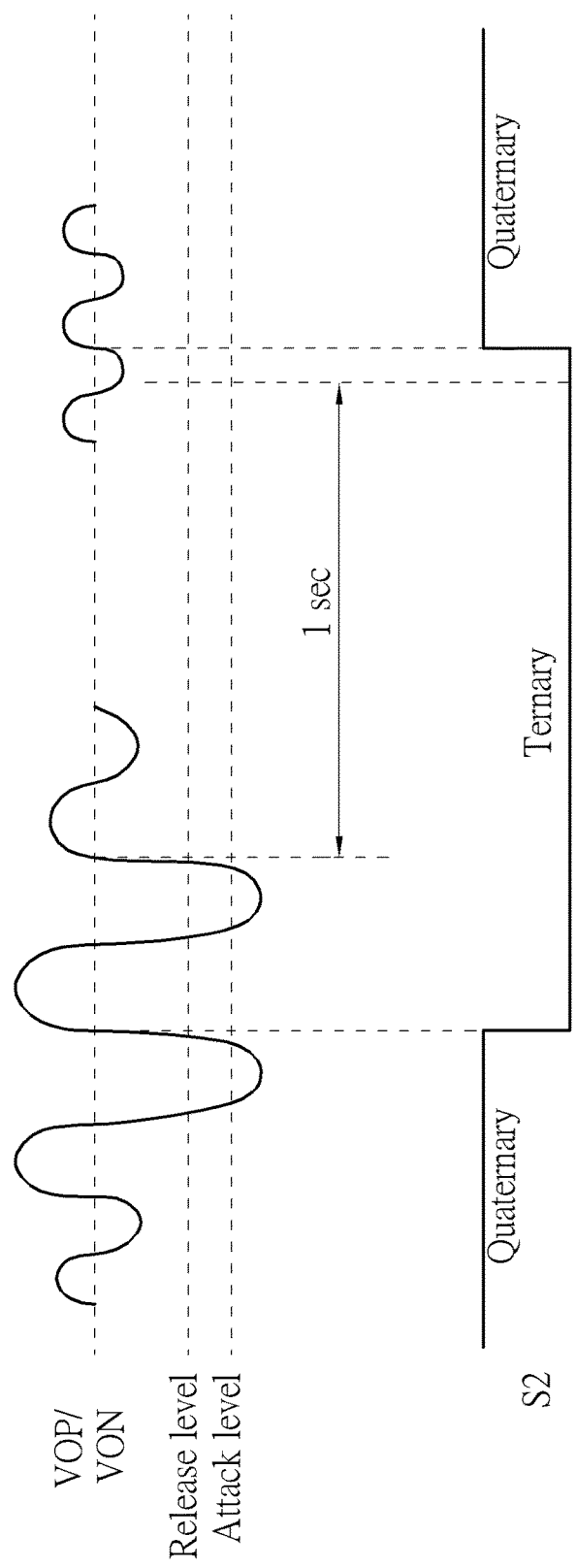
FIG. 3 is a diagram illustrating a working condition of a quaternary/ternary detecting circuit according to an embodiment of the present invention.

FIG. 3 is a diagram illustrating a working condition of the quaternary/ternary detecting circuit 202 according to an embodiment of the present invention. As shown in FIG. 3, if the quaternary/ternary detecting circuit 202 detects that the output signal $V_{op}/V_{ON}$ of the gain stage 210 is lower than a first threshold value, i.e. the attack level in FIG. 3, which means the audio amplifier is operating with a large power, then the signal S2 becomes logic value '0' when the output signal $V_{op}/V_{ON}$ of the gain stage 210 reaches the first zero voltage level less than the first threshold value to make the quaternary/ternary modulation selecting circuit 201 output the ternary signal. Then, if the quaternary/ternary detecting circuit 202 detects that the output signal $V_{op}/V_{ON}$ of the gain stage 210 is higher than a second threshold value for one second, i.e. the release level in FIG. 3, which means the audio amplifier is operating with a small power, then the signal S2 becomes logic value '1' when the output signal $V_{op}/V_{ON}$ of the gain stage 210 reaches the first zero voltage level after detecting the output signal $V_{op}/V_{ON}$ has been higher than the second threshold value for one second to make the quaternary/ternary modulation selecting circuit 201 output the quaternary signal. In one embodiment of the present invention, the detection of the quaternary/ternary detecting circuit 202 can be implemented with voltage comparators.

Figure 4A:
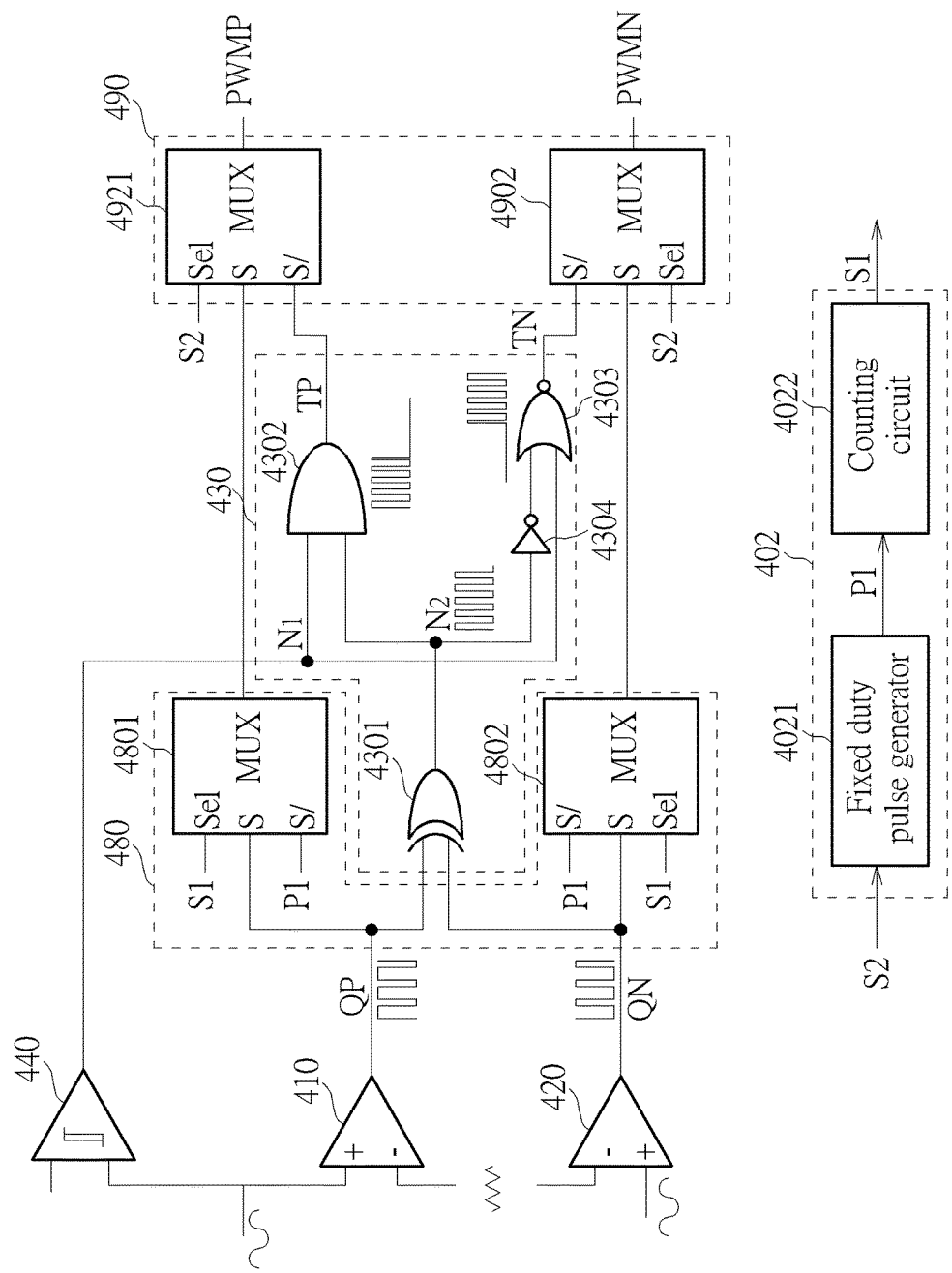
FIG. 4A is a diagram illustrating the quaternary/ternary modulation selecting circuit according to an embodiment of the present invention.

FIG. 4A is a diagram illustrating the quaternary/ternary modulation selecting circuit 201 according to an embodiment of the present invention. The quaternary/ternary modulation selecting circuit 201 comprises a signal generating circuit, a pulse generating circuit 402 and a selecting circuit, wherein the signal generating circuit comprises comparators 410, 420, 440 and a ternary signal generating circuit 430, the comparators 410 and 420 are arranged for comparing the output signals of the integrator 220 with a triangular wave to generate a quaternary signal comprising a positive quaternary wave QP and a negative wave QN; the ternary signal generating circuit 430 comprises a general ternary wave generating circuit unit 4301 for generating a general ternary wave according to the positive quaternary wave QP and the negative wave QN; and the comparator 440 is arranged for comparing a common voltage VCM with one of the output signals of the integrator 220, wherein the output of the comparator 440 is coupled to a node N1 as shown in FIG. 4A. In this embodiment, the common voltage VCM is set to be half a supply voltage VDD, i.e. VDD/2, but this is not a limitation of the present invention. More specifically, the general ternary wave generating circuit unit 4301 is implemented by an XOR gate whose inputs are coupled to the outputs of the comparators 410 and 420, i.e. the positive quaternary wave QP and the negative wave QN, and the general ternary wave generating circuit unit 4301 generates a general ternary wave to a node N2. In addition, the ternary signal generating circuit 430 further comprises an AND gate 4302, an inverter 4304 and a NOR gate 4303, wherein the AND gate 4302 receives signals from the nodes N1 and N2 to generate a positive ternary wave TP, an input of the inverter 4304 is coupled to the node N2, and the NOR gate 4303 receives signals from the node N1 and an output of the inverter 4304 to generate a negative ternary wave TN.

As the above paragraph describes, the inrush current usually occurs in the initial successive pulses when the mode of the quaternary/ternary modulation selecting circuit 201 changes to the quaternary modulation from the ternary modulation and when the audio amplifier 200 starts up. Therefore, in this embodiment, two pulses with 25% duty cycles are inserted before the quaternary signal is introduced when the audio amplifier 200 starts up or goes into quaternary modulation from ternary modulation to suppress the inrush current. The pulse generating circuit 402 comprises a fixed duty pulse generator 4021 and a counting circuit 4022, wherein the fixed duty pulse generator 4021 is arranged for generating a signal P1 comprising two pulses with 25% duty cycle to the counting circuit 4022 and the selecting circuit according to the signal S2, and the counting circuit 4022 is arranged for receiving the two pulses with 25% duty cycle then sending a signal S1 to the selecting circuit.

The selecting circuit further comprises a first selecting unit 480 comprising two multiplexers (MUXs) 4801 and 4802 and a second selecting unit 490 comprising two multiplexers 4901 and 4902, wherein an input terminal, an inverting input terminal and a selecting terminal of the MUX 4801 are respectively coupled to the positive quaternary wave QP, the signal P1 and the signal S1; and an input terminal, an inverting input terminal and a selecting terminal of the MUX 4802 are respectively coupled to the negative quaternary wave QN, the signal P1 and the signal S1. An input terminal, an inverting input terminal and a selecting terminal of the MUX 4901 are respectively coupled to an output terminal of the MUX 4801, the positive ternary wave TP and the signal S2; and an input terminal, an inverting input terminal and a selecting terminal of the MUX 4902 are respectively coupled to an output terminal of the MUX 4802, the negative ternary wave TN and the signal S2. In addition, the output terminal of the MUXs 4901 and 4902 are coupled to the output stage 230 of the audio amplifier 200.

Figure 4B:
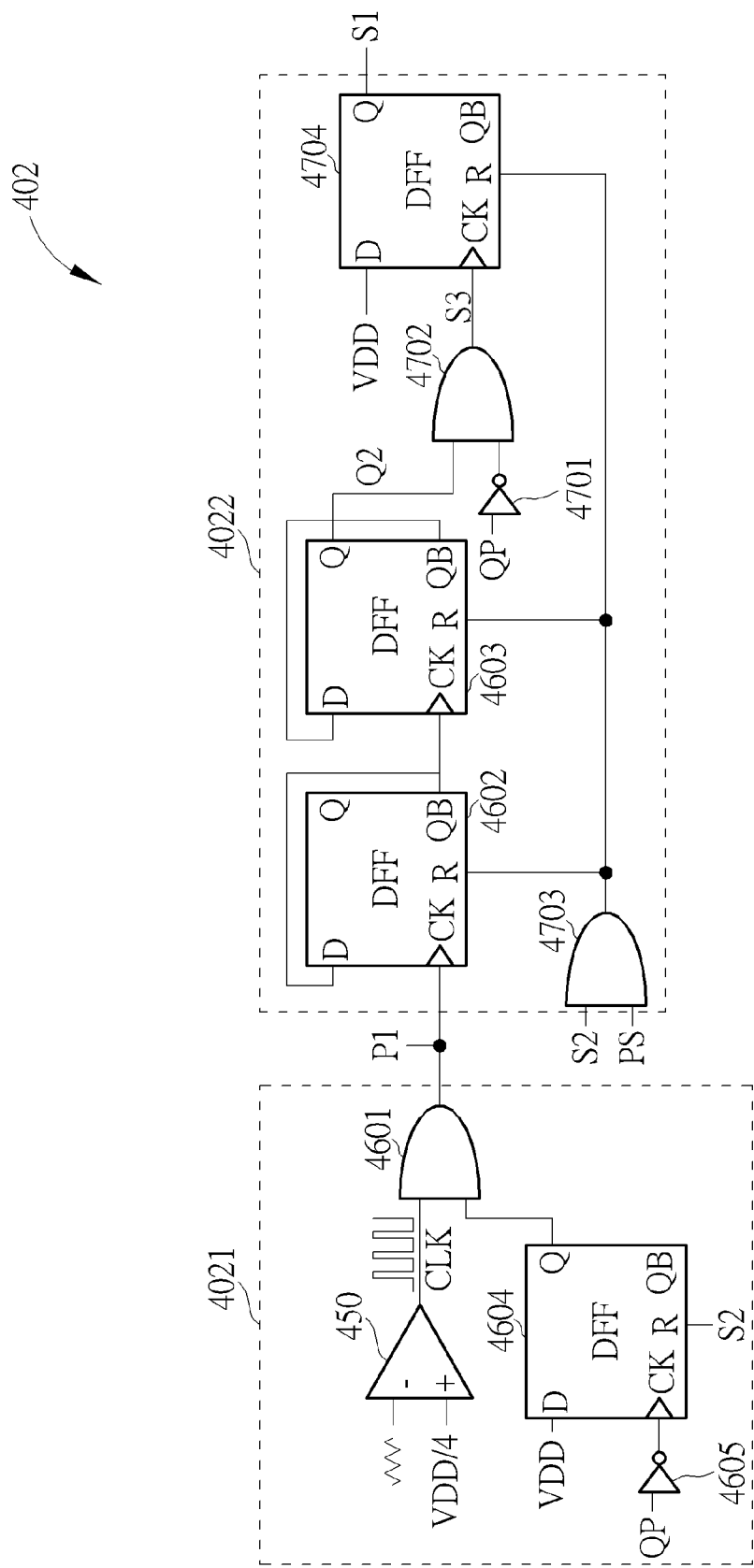
FIG. 4B is a diagram illustrating the architecture of a pulse generating circuit according to an embodiment of the present invention.

To comprehensively explain the function of the pulse generating circuit 402, refer to FIG. 4B, which is a diagram illustrating the architecture of the pulse generating circuit 402 according to an embodiment of the present invention. As shown in FIG. 4B, the fixed duty pulse generator 4021 of the pulse generating circuit 402 comprises a comparator 450 for comparing the triangular wave with a quarter of the supply voltage VDD, i.e. VDD/4, to generate a clock signal CLK with 25% duty cycle, an AND gate 4601, a D flip-flop 4604 and an inverter 4605, wherein the inputs of the AND gate 4601 are coupled to an output of the D flip-flop 4604 and the clock signal CLK with 25% duty cycle, the AND gate 4601 generates the signal P1 at an output terminal, and the D flip-flop 4604 serves as a latch to transmit the supply voltage VDD to one of the inputs of the AND gate 4601 and receives an inverted positive quaternary wave as a trigger as shown in FIG. 4B. The counting circuit 4022 of the pulse generating circuit 402 comprises two counters 4602 and 4063, an inverter 4701, two AND gates 4702 and 4703, a D flip-flop

4704, wherein counters 4602 and 4603 for generating a signal S2 are implemented by D flip-flops and coupled between the output of the AND gate 4601 and one of the input of the AND gate 4702, and the other input of the AND gate 4702 is coupled to an output of the inverter 4701 arranged for inverting the positive quaternary wave QP, and the D flip-flop 4704 serves as a latch to receive a signal S3 generated by the AND gate 4702 to generate a signal S1 to the selecting circuit. In addition, the inputs of the AND gate 4703 are coupled to the signal S2 and a power signal PS and an output of the AND gate 4703 is coupled to the reset terminals of the D flip-flops 4602, 4603 and 4704 for resetting these D flip-flops.

More specifically, when the audio amplifier 200 starts up at power on, the power up signal PS goes high. When the audio amplifier 200 goes into quaternary modulation from ternary modulation, the signal S2 goes high. When one of the signals PS and S2 goes high, the D flip-flops 4602, 4603, 4604 and 4704 are reset and the signal S1 first becomes logic value '0'. Next, the clock signal CLK with 25% duty cycle is transferred to the output of the AND gate 4601 (i.e. the signal P1) and enters the counters 4602 and 4603 and the first selecting unit 480 respectively. Due to the signal S1 still being logic value '0', the first selecting unit 480 and the second selecting unit 490 output the signal P1 to the output stage 230. After two pulses with 25% duty cycle are outputted and received by the counters 4602 and 4603, the signal Q2 which is logic value '1' is generated according to the characteristic of the counters implemented by D flip-flops, and the signal S1 outputted by the D flip-flop 4704 thus becomes logic value '1'. Therefore, the quaternary signal is outputted by the first selecting unit 480 and the second selecting unit 490, and the audio amplifier 200 enters the quaternary modulation mode thereafter. The audio amplifier 200 outputs two pulses with 25% duty cycle before the quaternary signal when the audio amplifier 200 starts up or goes into quaternary modulation from ternary modulation. Therefore, the over-current can be effectively suppressed.

Figure 5:
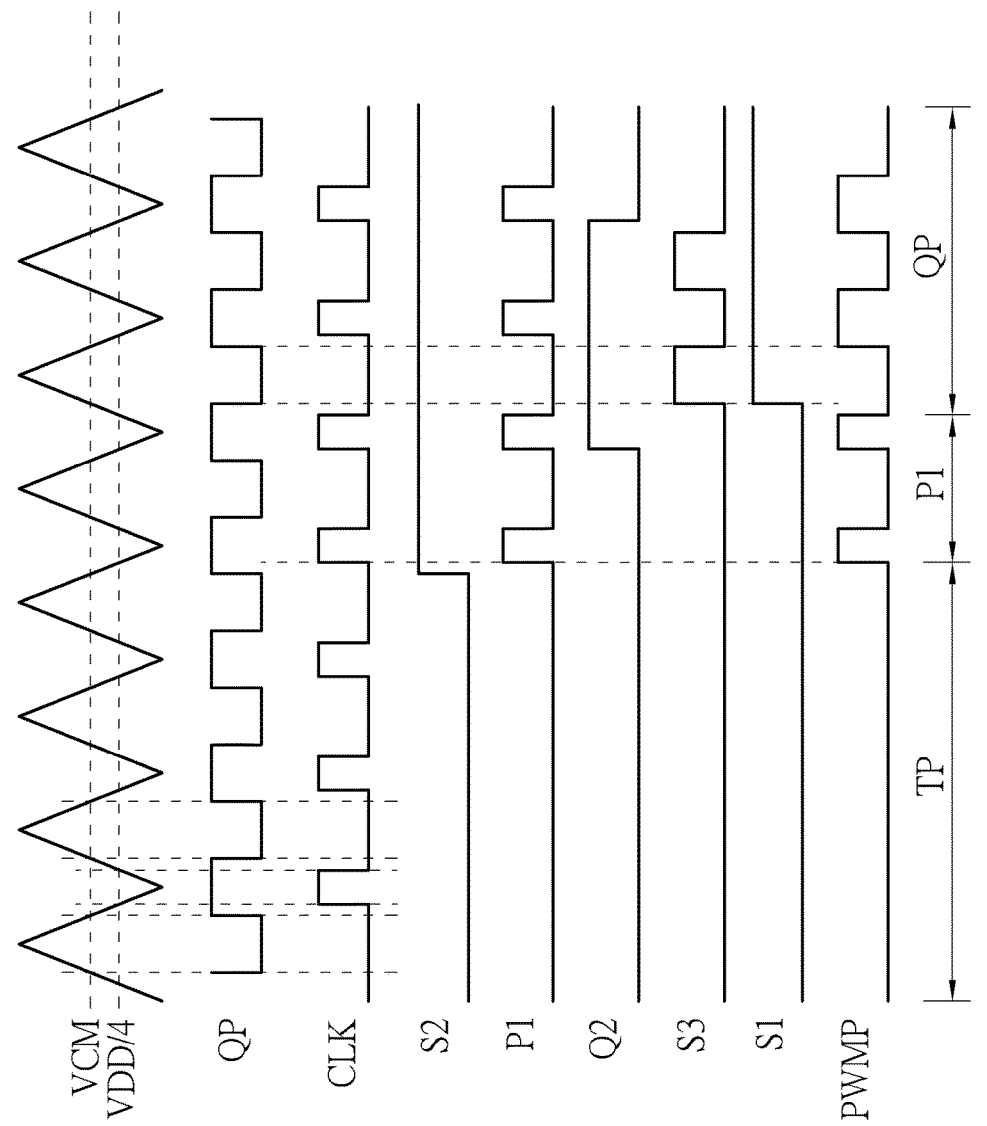
FIG. 5 is a timing diagram illustrating a pulse generating circuit of the quaternary/ternary modulation selecting circuit generating two pulses with 25% duty cycle according to an embodiment of the present invention.

FIG. 5 is a timing diagram illustrating a pulse generating circuit 402 of the quaternary/ternary modulation selecting circuit 201 generating two pulses with 25% duty cycles according to an embodiment of the present invention. As shown in FIG. 5, if the signal S2 goes high, the signal P1 becomes the clock signal CLK with 25% duty cycle and is transferred by the selecting circuit to the output stage 230. The signal Q2 generated by the counters 4602 and 4603 goes high after two pulses with 25% duty cycle are received by the counters 4602 and 4603, and the signal S1 thus goes high and is transferred to the first selecting unit 480. The quaternary signal will therefore be transferred to the output stage 230 instead. The audio amplifier 200 operates in quaternary modulation mode thereafter.

Figure 6:
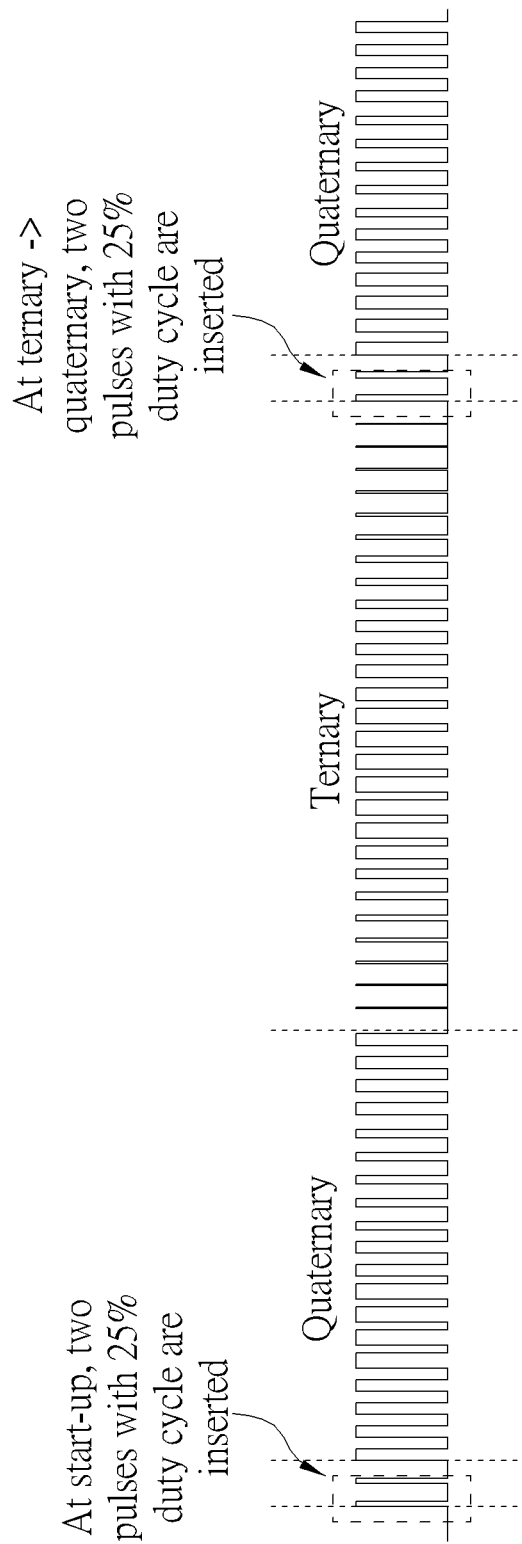
FIG. 6 is a diagram illustrating the signal outputted by the quaternary/ternary modulation selecting circuit after inserting two pulses with 25% duty cycle according to an embodiment of the present invention.

FIG. 6 is a diagram illustrating the signal outputted by the quaternary/ternary modulation selecting circuit 201 after inserting two pulses with 25% duty cycles according to an embodiment of the present invention. According to the embodiments of FIG. 4A, FIG. 4B and FIG. 5, FIG. 6 illustrates the signal outputted by the quaternary/ternary modulation selecting circuit 201. As shown in FIG. 6, two pulses with 25% duty cycle are inserted when the audio amplifier 200 starts up and goes into quaternary modulation mode from ternary modulation mode to suppress the over-current accordingly.

Figure 7A:
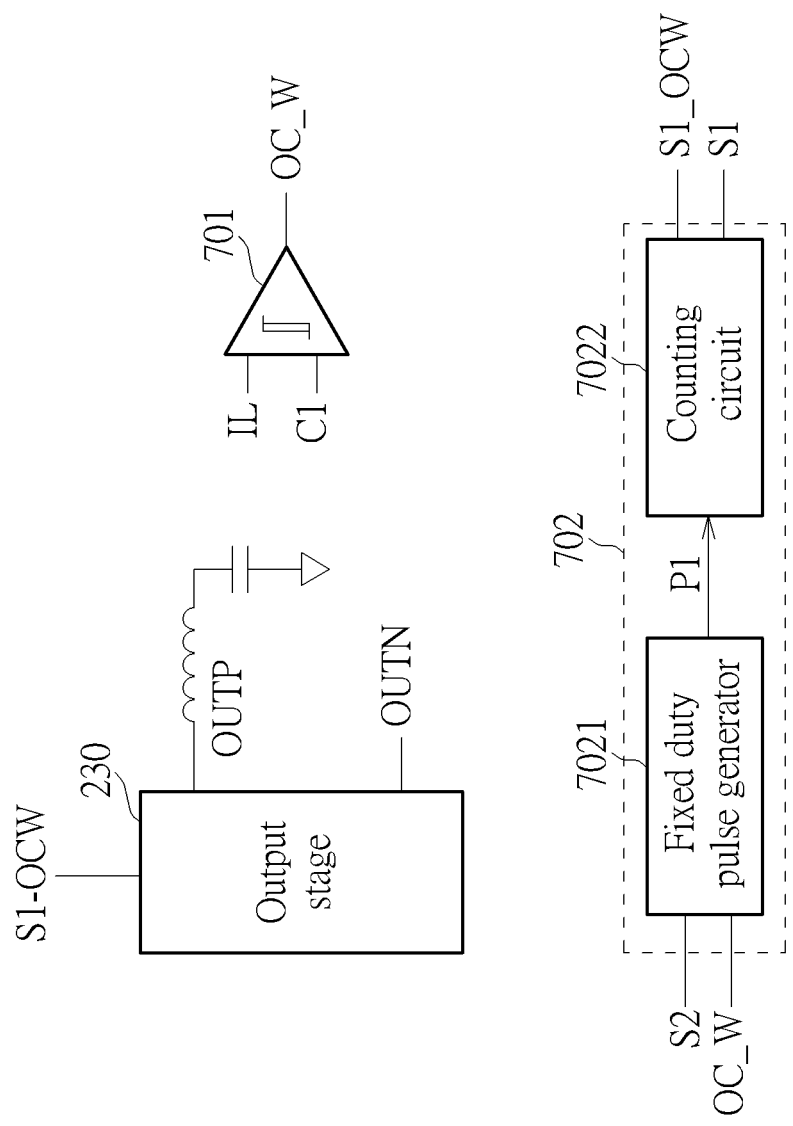
FIG. 7A is a diagram illustrating a detecting circuit and a pulse generating circuit according to another embodiment of the present invention.

In another embodiment of the present invention, the pulses with limited duty cycles (e.g., 25%) are not only inserted when the audio amplifier 200 starts up or goes into quaternary modulation from ternary modulation, but also immediately after inrush current occurs. FIG. 7A is a diagram illustrating a detecting circuit 701 and a pulse generating circuit 702 according to another embodiment of the present invention. In this embodiment, based on the architecture of the quaternary/ternary modulation selecting circuit depicted in FIG. 4A, the detecting circuit 701 and the revised pulse generating circuit 702 are added for detecting inrush current in any moment, wherein the detecting circuit 701 is implemented by a comparator and arranged for comparing the loading current IL outputted by the output stage 203 with a predetermined current C1. If the loading current IL is stronger than the predetermined current C1, i.e. the over-current event occurs, the detecting circuit 701 generates a signal OC_W to the pulse generating circuit 702. After receiving the signal OC_W, the pulse generating circuit generates a plurality of pulses whose duty cycles are around 25% to the output stage to suppress the inrush current. In this embodiment, the plurality of pulses with limited duty cycles are eight pulses with 25% duty cycle, but this is not a limitation of the present invention. If the inrush current still exists after eight pulses with 25% duty cycle are outputted and received by the counting circuit 7022, a signal S1_OCW is generated to the output stage to shut down the output stage to prevent damage to the audio amplifier 200.

Figure 7B:
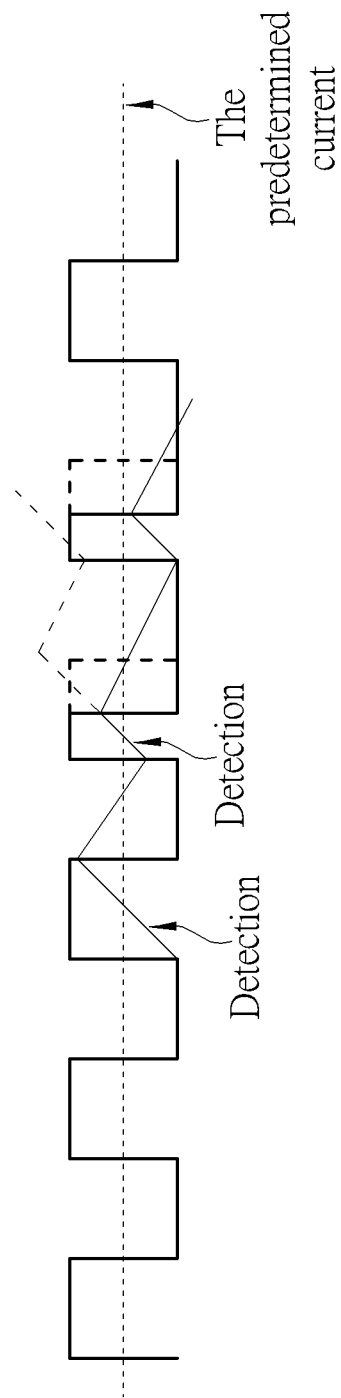
FIG. 7B is a timing diagram illustrating the over-current being suppressed by a plurality of pulses with duty cycle around 25% after over-current is detected according to an embodiment of the present invention.

FIG. 7B is a timing diagram illustrating the over-current being suppressed by a plurality of pulses with duty cycle around 25% after over-current is detected (e.g. the output current of the audio amplifier 200 is larger than a predetermined value) according to an embodiment of the present invention. As shown in FIG. 7B, with the detecting circuit 701, the inrush current can be suppressed at any moment rather than continuing to increase which may cause damage to the audio amplifier 200.

In the embodiments of FIG. 2 to FIG. 7B, the number of inserted pulses and the duty cycle of the inserted pulses are not limited in the present invention, and can be more than two pulses depending on how many counters are used in the counting circuits 4022 and 7022. As long as the triangular wave is compared with a different voltage value, the different duty cycle can be obtained easily. Any alternative design which can generate a plurality of pulses whose duty cycles are around 25% to suppress the inrush current should fall within the scope of the present invention. Likewise, the architecture of the ternary signal generating circuit 430 is not limited as described above, as long as the architecture can generate the positive ternary wave TP and the negative ternary wave TN as depicted in FIG. 4A. In addition, the architecture of the pulse generating circuit 402 in FIG. 4B is only an example, and not a limitation of the present invention. As long as it can generate the signal S1 and the signal P1 as described above, these alternative designs should fall within the scope of the present invention.

Figure 8:
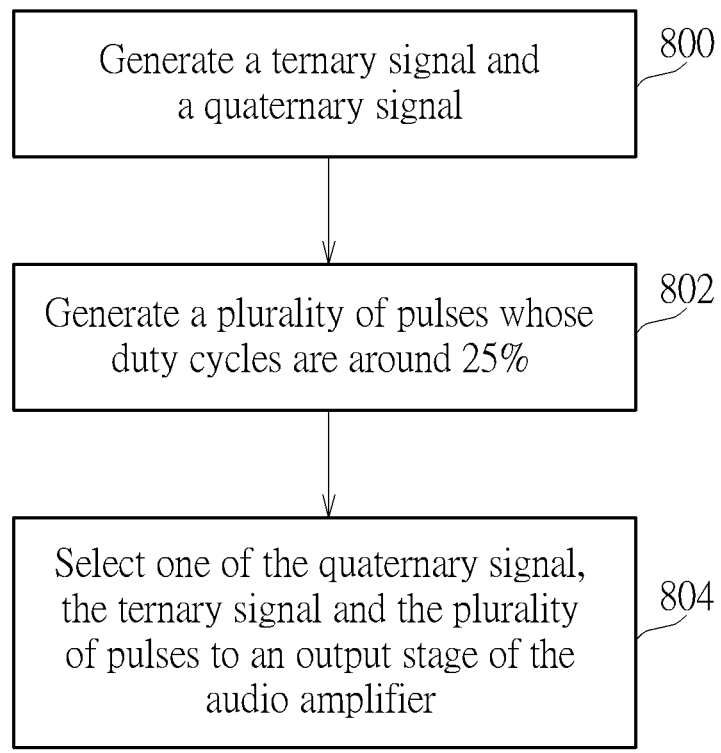
FIG. 8 is a flowchart illustrating a quaternary/ternary modulation selecting method according to an embodiment of the present invention.

FIG. 8 is a flowchart illustrating a quaternary/ternary modulation selecting method according to an embodiment of the present invention. Referring to FIG. 2 to FIG. 7 and the associated content at the same time, the flow of FIG. 8 is described as follows:

Step 800: generate a ternary signal and a quaternary signal.

Step 802: generate a plurality of pulses whose duty cycles are around 25%.

Step 804: select one of the quaternary signal, the ternary signal and the plurality of pulses for an output stage of the audio amplifier.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A quaternary/ternary modulation selecting circuit of an audio amplifier, comprising:
a signal generating circuit, for generating a ternary signal and a quaternary signal;
a pulse generating circuit, arranged to generate a plurality of pulses with fixed duty cycles; and
a selecting circuit arranged to select one of the quaternary signal, the ternary signal and the plurality of pulses for an output stage of the audio amplifier.

2. The quaternary/ternary modulation selecting circuit of claim 1, wherein when the audio amplifier starts up, the selecting circuit outputs at least one of the pulses to the output stage of the audio amplifier.

3. The quaternary/ternary modulation selecting circuit of claim 1, wherein when a mode of the quaternary/ternary modulation selecting circuit switches from a ternary mode to a quaternary mode, the selecting circuit outputs at least one of the pulses to the output stage of the audio amplifier.

4. The quaternary/ternary modulation selecting circuit of claim 3, wherein when the mode of the quaternary/ternary modulation selecting circuit switches from the ternary mode to the quaternary mode, the selecting circuit outputs at least one of the pulses to the output stage before any quaternary signal is outputted to the output stage.

5. The quaternary/ternary modulation selecting circuit of claim 1, wherein when an output current of the audio amplifier is larger than a predetermined value, the selecting circuit outputs at least one of the pulses to the output stage of the audio amplifier.

6. The quaternary/ternary modulation selecting circuit of claim 1, wherein the selecting circuit comprise:
a first selecting circuit for selectively outputting either the plurality of pulses or the quaternary signal according to a first selecting signal;
a second selecting circuit for selectively outputting either the ternary wave or an output of the first selecting circuit to the output stage according to a second selecting signal.

7. The quaternary/ternary modulation selecting circuit of claim 6, wherein the pulse generating circuit comprises:
a first comparator for comparing a triangular wave with a voltage source to generate the plurality of pulses;
a counting circuit, coupled to the first comparator, wherein when the selecting circuit starts to output the pulses to the output stage, the counting circuit counts a number of pulses that has been outputted by the selecting circuit, and the counting circuit further generates the first selection signal to the first selecting circuit to stop outputting the pulses when the number of pulses that has been outputted by the selecting circuit exceeds a predetermined value.

8. The quaternary/ternary modulation selecting circuit of claim 6, wherein the quaternary signal outputted by the signal generating circuit comprises a positive quaternary wave and a negative quaternary wave, wherein the positive quaternary wave and the negative quaternary wave are inverted to each other and are transmitted to the first selecting circuit.

9. The quaternary/ternary modulation selecting circuit of claim 8, wherein the ternary signal comprises a positive ternary wave and a negative ternary wave, the ternary signal is generated by a ternary signal generating circuit of the signal generating circuit, and the ternary signal generating circuit comprises:
a general ternary wave generating unit for generating a general ternary wave according to the positive quaternary wave and the negative quaternary wave; and
a first comparator for comparing one of the two input signals with a common voltage to determine one of the positive ternary wave and the negative ternary wave to serve as the general ternary wave, wherein the other one is logic value "0".

10. The quaternary/ternary modulation selecting circuit of claim 1, wherein the fixed duty cycles are around 25%.

11. A quaternary/ternary modulation selecting method of an audio amplifier, comprising:
generating a ternary signal and a quaternary signal;
generating a plurality of pulses with fixed duty cycles; and
selecting one of the quaternary signal, the ternary signal and the plurality of pulses for an output stage of the audio amplifier.

12. The quaternary/ternary modulation selecting method of claim 11, wherein the step of selecting one of the quaternary signal, the ternary signal and the plurality of pulses for the output stage of the audio amplifier comprises:
when the audio amplifier starts up, outputting at least one of the pulses to the output stage of the audio amplifier.

13. The quaternary/ternary modulation selecting method of claim 11, wherein the step of selecting one of the quaternary signal, the ternary signal and the plurality of pulses to the output stage of the audio amplifier comprises:
when a mode of the audio amplifier switches from a ternary mode to a quaternary mode, selecting at least one of the pulses for the output stage of the audio amplifier.

14. The quaternary/ternary modulation selecting method of claim 13, wherein the step of selecting one of the quaternary signal, the ternary signal and the plurality of pulses for the output stage of the audio amplifier comprises:
when the mode of the audio amplifier switches from the ternary mode to the quaternary mode, selecting at least one of the pulses for the output stage before any quaternary signal is outputted to the output stage.

15. The quaternary/ternary modulation selecting method of claim 11, wherein the step of selecting one of the quaternary signal, the ternary signal and the plurality of pulses for the output stage of the audio amplifier comprises:
when an output current of the audio amplifier is larger than a predetermined value, selecting at least one of the pulses for the output stage of the audio amplifier.

16. The quaternary/ternary modulation selecting method of claim 11, further comprising:
selectively outputting either the plurality of pulses or the quaternary signal according to a first selecting signal; and
selectively outputting either the ternary wave or one of the plurality of pulses with small percentage duty-cycle and the quaternary wave to the output stage according to a second selecting signal.

17. The quaternary/ternary modulation selecting method of claim 16, further comprising:
comparing a triangular wave with a voltage source to generate the plurality of pulses;
when starting to output the pulses to the output stage, counting a number of pulses that has been outputted to the output stage; and generating the first selection signal to stop outputting the pulses when the number of pulses that has been outputted exceeds a predetermined value.

18. The quaternary/ternary modulation selecting method of claim 16, wherein the quaternary signal comprises a positive quaternary wave and a negative quaternary wave, wherein the positive quaternary wave and the negative quaternary wave are inverted to each other.

19. The quaternary/ternary modulation selecting method of claim 18, wherein the ternary signal comprises a positive ternary wave and a negative ternary wave, and the method further comprises:
   generating a general ternary wave according to the positive quaternary wave and the negative quaternary wave; and
   comparing one of the two input signals with a common voltage to determine one of the positive ternary wave and the negative ternary wave to serve as the general ternary wave, wherein the other one is logic value "0".

20. The quaternary/ternary modulation selecting circuit of claim 11, wherein the fixed duty cycles are around 25%.

* * * * *